United States Patent
Chyan

(10) Patent No.: US 7,486,094 B2
(45) Date of Patent: Feb. 3, 2009

(54) APPARATUS FOR TESTING UN-MOULDED IC DEVICES USING AIR FLOW SYSTEM AND THE METHOD OF USING THE SAME

(76) Inventor: Moey Huey Chyan, 17, Lorong Hijau 1, 11600 Georgetown, Penang (MY)

( * ) Notice: Subject to any disclaimer, the term of this patent is extended or adjusted under 35 U.S.C. 154(b) by 0 days.

(21) Appl. No.: 11/303,232

(22) Filed: Dec. 16, 2005

(65) Prior Publication Data

US 2006/0158179 A1 Jul. 20, 2006

(30) Foreign Application Priority Data

Dec. 24, 2004 (MY) .............................. PI 2004 5353

(51) Int. Cl.
*G01R 31/26* (2006.01)

(52) U.S. Cl. .................... 324/765; 324/755; 324/758

(58) Field of Classification Search ................. None
See application file for complete search history.

(56) References Cited

U.S. PATENT DOCUMENTS

| 5,528,160 | A | * | 6/1996 | Fukumoto et al. ........... 324/760 |
| 5,894,217 | A | | 4/1999 | Igarashi et al. |
| 6,031,384 | A | | 2/2000 | Furuta |

* cited by examiner

*Primary Examiner*—Minh N. Tang
(74) *Attorney, Agent, or Firm*—Schmeiser, Olsen & Watts LLP

(57) ABSTRACT

An apparatus minimizes stress on un-moulded IC devices by use of an airflow system. A vacuum urges the DUT's into contact with the pivoted test fingers, thereby reducing damage to the IC. A fitting is connected to a vacuum pump which draws out air and creates a vacuum chamber in the area created by the lift/support and the test socket, thereby causing the supported un-moulded DUTs to move upward towards the test socket and into physical contact with the test pins. The index time is decreased in order to improve overall operating efficiency and costs of the test apparatus.

10 Claims, 4 Drawing Sheets

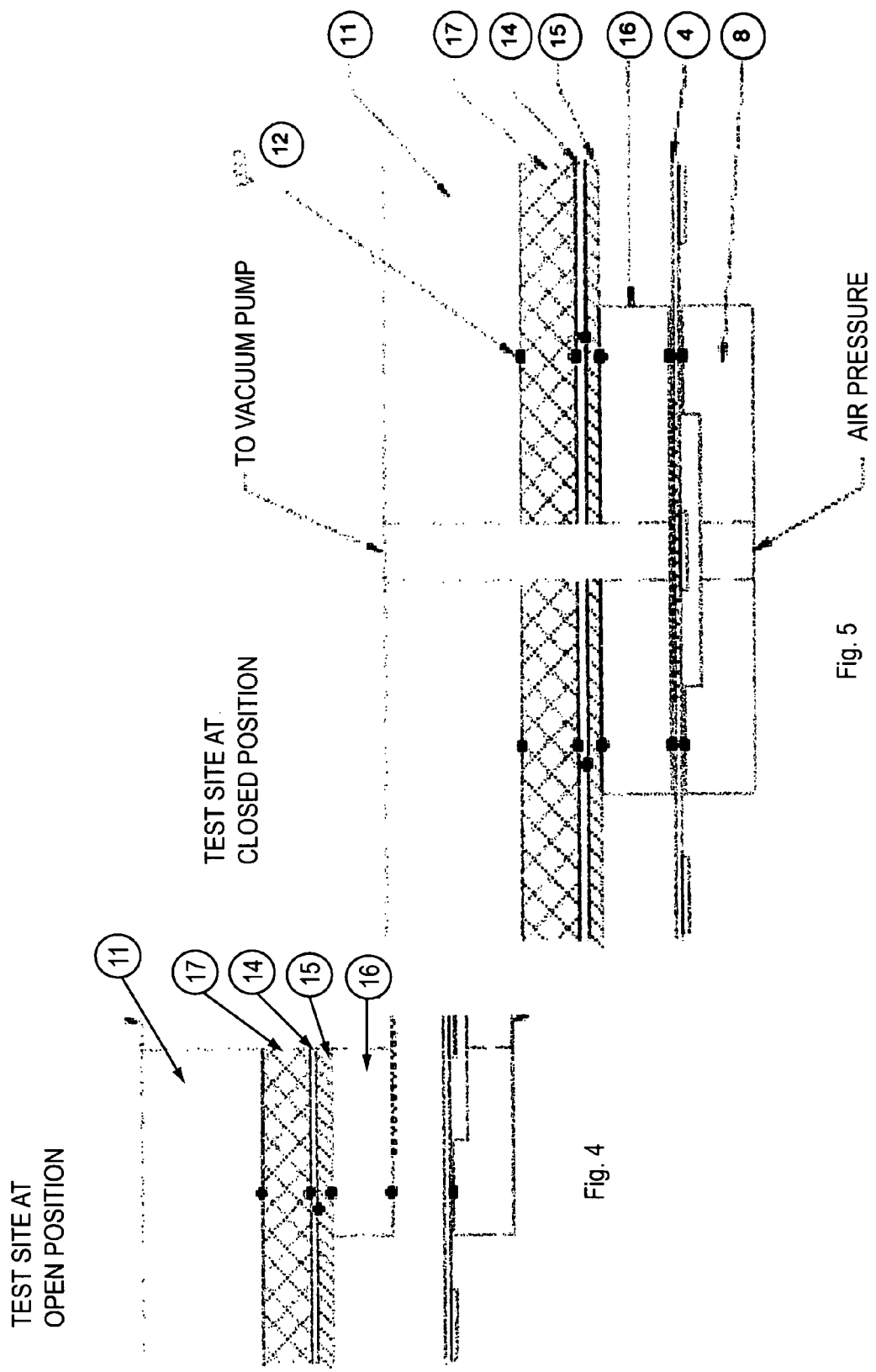

APPARATUS FOR TESTING UN-MOULDED IC DEVICES USING AIR FLOW SYSTEM AND THE METHOD OF USING THE SAME

This patent application claims priority from Malaysia Patent Application PI 20045353, filed Dec. 24, 2004, and assigned to Pentamaster Instrumentation SBN BHD, Plot 18 & 19, Technoplex Medan Bayan Lepas, Taman Perindustrian Bayan Lepas, Phase IV, 1190 Penang, Malaysia.

FIELD OF INVENTION

This invention relates to an apparatus for testing of semiconductor integrated circuits (IC) devices and method thereof, and more specifically to handling techniques and apparatus test handler thereof for efficient transfer of an un-moulded device under testing (DUT) through the test apparatus for the purpose of testing the said IC devices (DUT).

BACKGROUND OF THE INVENTION

Conventional IC device tests are generally carried out by picking up the IC molded dies with a using vacuum picker arms. DUTs are then placed on a test site with pivoted gold test fingers to test on the IC dies.

U.S. Pat. No. 5,894,217 shows a test handler having a turn table in which IC devices where a suction force is used to pick and place the said IC devices. U.S. Pat. No. 6,031,384 describes an IC testing method and apparatus where IC devices are carried and tested using a loader arm, an unloader arm and a contact arm without creating a vacuum for testing the said DUTs.

In testing IC devices, an automatic test handler is frequently used in combination with an IC tester to automatically move IC devices (DUT) to a test position at the test head of the IC tester. There are generally two types of test handlers. A vertical transfer type handler transfer the DUTs in a vertical direction by use of gravity. A horizontal transfer type handler places DUTs on a tray or carrier module for transfer in a horizontal direction to the test position. The test apparatus/test handler of the present invention is directed to a vertical transfer type handler.

In a typical horizontal type testing apparatus test handler, IC devices are aligned on a tray in a loading area and picked up, one by one, transferred to a test head of an IC tester and placed on a test socket of the test head by a pick and place mechanism or a robot hand of the test handler. The tested IC devices are taken from the test head and transferred to an unloading area and placed on a tray based on the test results.

In this type of test handler, the overall path of movement of the DUTs is lengthy and complicated. A relatively long time is required for positioning the DUT with the test socket, testing the DUT, and returning the tested IC device to the unloading area.

Index time, as defined in semiconductor industry, is the overall time required for handling IC device other than the time required for device testing. Since the index time is not the actual time for testing of the DUT, it is generally considered that the shorter the index time, the higher the test efficiency of the testing apparatus. A conventional test handler requires a relatively long index time because of the length of device transfer paths and complicated movements of the test handler.

A modem IC device has a large number of pins with a small pitch. Each pin is very small in size and is mechanically weak. Thus, precise positioning is required to accurately place the IC device in a test position to match with the test socket with a large number of corresponding contact pins during testing. As fine positioning of the IC devices needs complicated adjustments and synchronization of various components, errors tend to arise in placing or extracting the IC devices with respect to the test socket. This may deform the pins of the DUTs and thereby make the test unreliable.

An example of a conventional type test handler is shown in FIG. 2.

FIG. 2 is a schematic diagram showing a plan view of a test handler (100). A tray (20) having the IC devices to be tested is transferred from the loading area to a transfer station (21) (dotted line) where each of the IC devices is picked up by a suction end (10) of a pick and place mechanism and transferred to a test socket (31) positioned at the test head of an IC tester.

The suction end (10) is movable along the arm (50) in a back and forth direction (Y). The contact arm (50) can move in a right and left direction (X) along rails (40). Thus, the suction end (10) can freely take a position by the movement in the X and Y directions on a surface of the test handler (100).

By placing the IC device on the test socket (31), an IC tester (not shown) supplies test signals to the IC device on the test socket (31) and the resulted output signals from the IC device are evaluated by the IC tester. The suction end (10) picks up the DUTs that have been tested and transferred to a tray on a receiving station (22) (dotted line). It then places the IC devices depending on the test results. The IC devices on the tray are transferred to an unloading area (23) where the IC devices are unloaded with the trays for the next process, such as a molding, burning, packing and shipping for customers.

FIG. 1 is a side view showing an example of a suction end used in the pick and place mechanism of FIG. 2. In this example, the suction end (10) is provided with an air pipe (not shown) connected to an air cylinder to provide a suction air force. When a suction is applied, the suction end (10) attracts the IC device below and picks up the IC device by the suction air force. The suction end (10) is movable in the X and Y directions on the testing apparatus. The suction end (10) transfers each IC device from the transfer area (21) to the test socket (31) and from the test socket (31) to the receiving station (22).

During the process involved in the conventional testing apparatus/handler, the operation of placing the IC device on the test socket (31) sometimes fail because of an inaccurate positioning of the IC device with respect to the test socket. Such inaccurate positioning may occur when the suction end (10) picks up the IC device while moving in the X and Y directions at a relatively high speed. Suction end (10) may therefore not accurately place the DUT in the desired position when placing the IC device. The suction end (10) also may fail to accurately position the DUT due to the poor surface condition of an IC device, mechanical vibrations, or other factors.

Therefore, in the conventional testing apparatus/handler as exemplified in FIGS. 1 and 2, a relatively large index time is needed for supplying IC devices to the IC socket. As a result the test efficiency is limited by the index time. In addition, positioning errors sometimes occur because of the inaccuracy of the pick and place mechanism of the testing apparatus/handler.

Moreover, all dies must be molded during testing on apparatus/handler in order to conduct tests. This wastes the die casting materials. Physical contact with pivoted gold test fingers or test sockets may also cause severe damage to the IC.

SUMMARY OF THE INVENTION

The present invention saves the cost of testing, as the DUTs are un-moulded. Further, the present invention uses an air vacuum to force the DUT surface into contact with the pivoted test fingers to minimize damage to the IC.

The testing apparatus/handler of the present invention uses airflow to force the DUT and the test fingers together, whereas conventional testing apparatus/handler uses the air vacuum picker arm to place the DUTs to test fingers. The present invention uses air to contact while a conventional testing apparatus/handler uses physical strength.

It is therefore, an object of the present invention is to provide an apparatus/test handler for testing un-moulded IC devices using air flow system so as to reduce or avoid physical contact with DUTs while performing the tests.

It is another object of the present invention to save costs by testing un-moulded DUTs.

It is a further object of the present invention to use air vacuum to force the DUT surface into contact with pivoted gold test fingers so as to minimize damage to the un-moulded IC and thereby avoid excessive physical stress on the said contact.

It is a further object of the present invention to provide a test apparatus/test handler which is capable of accurately positioning the IC devices to be tested without positioning error and damages to lead pins of the IC devices.

It is another further object of the present invention to provide a test apparatus/test handler which is capable of decreasing an index time to improve the overall efficiency of the test apparatus.

It is another further object of the present invention to provide a method of testing un-moulded IC devices using the said apparatus/test handler.

To achieve these objectives, the apparatus/test handler of the present invention has a lift/support which moves towards the test apparatus/test socket having a plurality of test pins using a vacuum to force the DUT surface into contact with the pivoted gold test fingers and sandwiches the un-moulded DUTs between the test socket and the support holder.

The test handler of the present invention includes:

a lift/support for resting a plurality of un-moulded DUTs, moving upwards towards the test socket having a plurality of test pins, the said lift/support being connected to a support holder (not shown in FIGS.) that closes against the test socket, the said lift/support supporting a plurality of IC devices to be tested by the test apparatus/test socket and sandwiches the said DUTs between the said test socket and the support holder, air being flown out from any direction opposite to the test pins of the test socket and a rubber/insulating seal resting above an alignment plate which in turn rests on an insulator plate, the alignment plate resting upon an insulator plate which in turn rests on a load board, the said load board being in contact with the opposite side of the test socket, the said insulating seal seals off the air and creates a vacuum chamber inside the room created by the said lift/support and the said test socket causing the supported un-moulded DUTs to move upwards towards the test socket thereby have physical contact with the test pins of the test socket;

an upper part having an alignment plate resting above the said insulator plate made of non-conductor insulating material aligning the said test socket by accurately positioning the IC devices in the test position without positioning error and damages to lead pins of the IC devices, the said alignment plate resting below a test-base plate being guided mechanically by at least four guide posts during upward movement of the lift/support on which the said DUTs rest;

a sensing element in the said upper part for sensing the alignment of the said test socket and the said un-moulded DUTs, the said sensor sending feedbacks signals to the alignment plate thereby accurately positioning the said DUTs by movably changing the place of he said DUTs on the guide tracks of the said lifter/support, thereby reducing chances of damage to lead pins (not shown in FIGS.) of the IC devices as well as the said test socket during contact;

a test-base plate in the said upper part of the said test apparatus/handler supporting the housing comprising the said sensing element, rubber/insulating seal, alignment plate, load board, insulator plate and test socket;

a fitting to connect to a vacuum hose (not shown in FIGS.) in the said upper part of the test apparatus/handler finally connected to a vacuum pump (not shown in FIGS.) located separately which flows out air from any direction opposite to the test pins (not shown in FIGS.) of the test socket and creates a vacuum chamber inside the room created by the said lift/support and the said test socket causing the supported un-moulded DUTs to move upward towards the test socket thereby having physical contact with the test pins of the test socket; and a lower part of the test apparatus/handler having a plurality of guide posts fastened to the housing base plate by nuts, the hosing of the lower part having the lift/support which is movable in upward direction during the test and on other hand in downward direction after the test, and both the said lift/support and support holder being rest on the said housing base plate.

According to the present invention, the apparatus/test handler has a vacuum hose (not shown in FIGS.) capable of causing air flow to urge the DUTs and the test fingers (not shown in FIGS.) together thereby using air to contact un-moulded DUTs with pivoted gold test fingers (not shown in FIGS.) ensuring minimal damage to the IC.

In the present invention, dies need not to be molded during testing on the said apparatus/handler in order to conduct tests. This saves the die casting materials, if the DUTs are somehow damaged, ensuring cost saving.

The present invention also describes a method of testing un-moulded IC devices using the said apparatus/test handler.

The method of testing un-moulded IC devices using the said apparatus/test handler includes the steps of:

moving the lift/support upward towards the test socket, the lift/support being connected to a support holder that closes up against the test socket, the said lift/support supporting a plurality of IC devices to be tested by the test apparatus/test socket and sandwiches the said DUTs in between the said test socket and the support holder;

flowing air from a direction opposite to the test pins of the test socket and a rubber/insulating seal resting above an alignment plate which in turn rests on an insulator plate, the alignment plate being resting upon the insulator plate which in turn rests on a load board, the load board being in contact with the opposite side of the test socket;

stopping the flow of air by the said insulating seal and creating a vacuum chamber inside the room created by the said lift/support and the said test socket causing the supported un-moulded DUTs to move upwards towards the test socket so as to thereby have physical contact with the test pins of the test socket;

aligning the said test socket by accurately positioning the IC devices to be tested without a positioning error and damage to lead pins of the IC devices, the said alignment plate resting below a housing base plate being guided mechanically by at least four guide posts during upward movement of the support holder on which the said DUTs rest;

sensing the positioning alignment of the said test socket and the said un-moulded DUTs by a sensing element in the said upper part of the hosing, the said sensor in turn senses and feedbacks signals to the alignment plate thereby accurately positions the said DUTs by movably changing the place of the said DUTs on the guide tracks of the said lifter/support thereby reducing chances of damage to lead pins of the IC devices as well as the said test socket during contact;

flowing air from a direction opposite to the test pins of the test socket and creating a vacuum chamber inside the room created thereby by a vacuum hose in the said upper part of the test apparatus/handler connected to a vacuum pump located separately causing the supported un-moulded DUTs to move upward towards the test socket thereby having physical contact with the test pins of the test socket.

The method of testing uses the said test apparatus/test handler to decrease index time in order to improve overall operating efficiency and costs of the said test apparatus.

These and other objects, advantages and features of the invention will be more readily understood and appreciated by reference to the detailed description of the drawings.

BRIEF DESCRIPTION OF THE DRAWINGS

FIG. 4 is a schematic view of the apparatus according to the present invention illustrating test apparatus/test handler for un-moulded IC devices where the test site is at open position;

FIG. 5 is a schematic view of the apparatus according to the present invention illustrating test apparatus/test handler for un-moulded IC devices where the test site is at closed position.

DESCRIPTION OF THE PREFERRED EMBODIMENT

Figure 1:
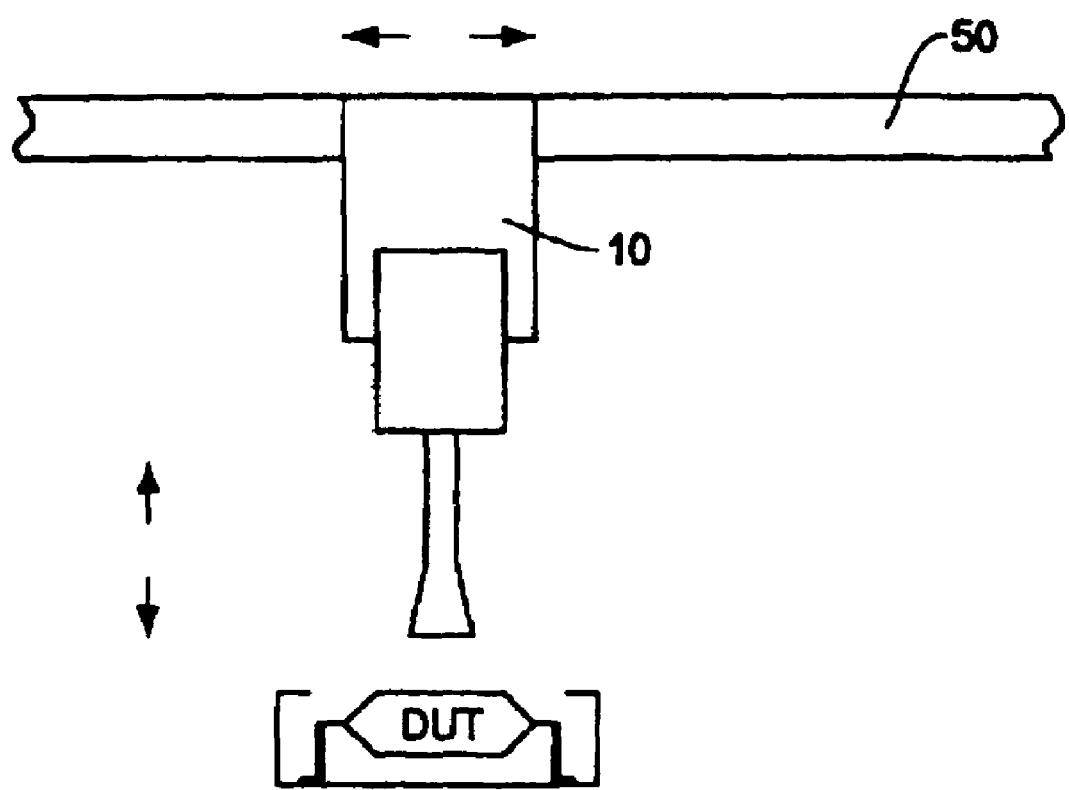
FIG. 1 is a view of the apparatus illustrating an example of conventional test apparatus/test handler and method for moulded IC device.
Figure 2:
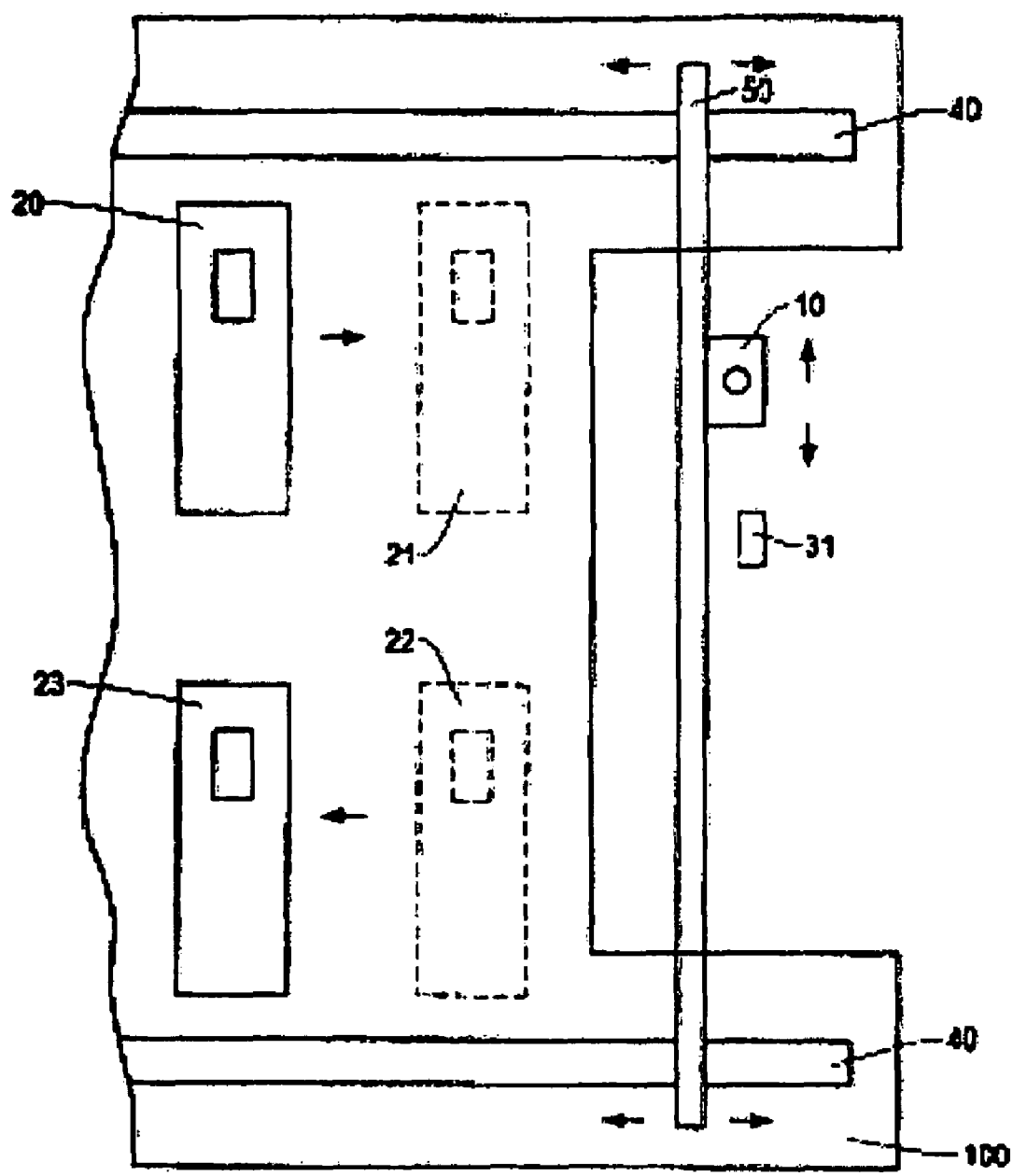
FIG. 2 is another view of the apparatus illustrating an example of conventional test apparatus/test handler and method for moulded IC device.
Figure 3:
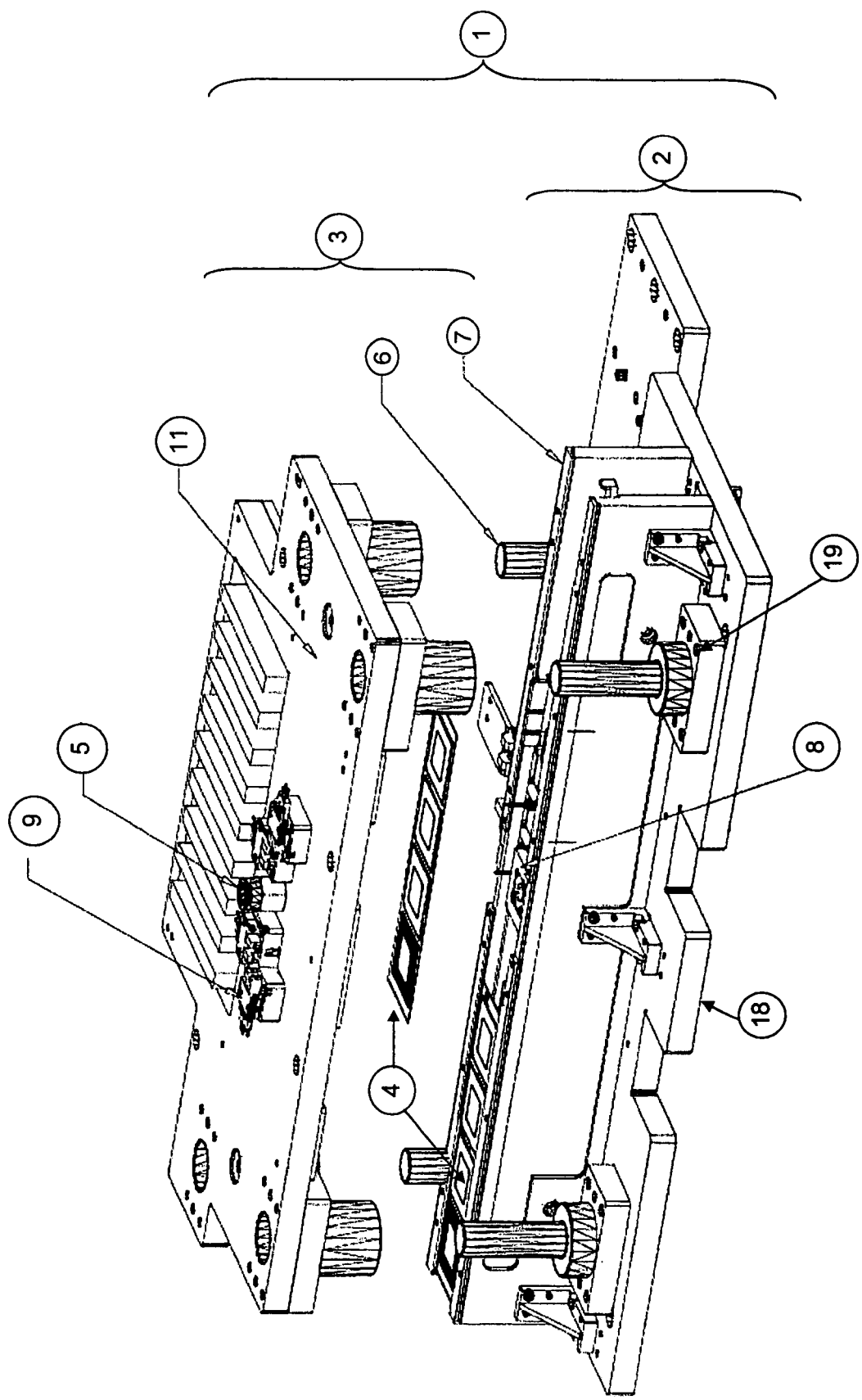
FIG. 3 is an isometric view of the apparatus according to the present invention illustrating test apparatus/test handler for un-moulded IC device.

Referring to FIGS. 3-5, the test apparatus/test handler (1) has a lift/support (8) for placing a plurality of un-moulded DUTs (4). The said lift/support (8) moves upwards towards the test socket (16). Test socket (16) has a plurality of test pins (not shown in FIGS.). The said lift/support (8) is connected to a support holder (not shown in FIGS.) that closes up against the test socket (16). The said lift/support (8) supports and lifts a plurality of IC devices (4) to be tested by the test apparatus/test socket (16) and sandwiches the said DUTs (4) between the test socket (16) and the support holder. Air flows from a direction opposite to the test pins (not shown in FIGS.) of the test socket (16). A rubber/insulating seal (12) rests above an alignment plate (17), which in turn rests on an insulator plate (14). Insulator plate (14) rests on load board (15). The said load board (15) is in contact with the opposite side of the test socket (16). The insulating seal (12) seals off the air and creates a vacuum chamber inside the room created by the said lift/support (8) and the said test socket (16), thereby causing the supported un-moulded DUTs (4) to move upwards towards the test socket (16) and into physical contact with the test pins of the test socket (16).

The housing of the test apparatus/test handler (1) comprises an upper part (3) and a lower part (2).

FIG. 4 shows the upper part (3) in open position and FIG. 5 shows the upper part (3) in a closed position. The upper part (3) has an alignment plate (17) resting above the said insulator plate (14). The insulator plate (14) is made of non-conductor insulating material and aligns the test socket (16) by accurately positioning the IC devices (4) to be tested. This eliminates or minimizes damage to the lead pins (not shown in the FIGS.) of the IC devices (4). The said alignment plate (17) rests below a test-base plate (11). The test base plate (11) is guided mechanically by four guide posts (6) during upward movement of the lift/support (8) on which the said DUTs rest (4).

Returning to FIG. 3, the lower part (2) of the test apparatus/handler (1) has a plurality of guide posts (6) fastened to the housing base plate (18) by nuts (19). The lower part (2) includes the lift/support (8), which is movable in an upward direction during the test and downward direction after the test. The lift/support (8) and support holder rest on the said housing base plate (18).

A sensing element (9), such as a miss-feed sensor, is located on the said upper part (3) of the hosing of the test apparatus/test handler (1) for sensing the alignment of the said test socket (16) and the said un-moulded DUTs (4). The said sensor (9) senses and feedbacks signals to the alignment plate (17), and accurately positions the said DUTs (4) by movably changing the place of the said DUTs (4) on the guide tracks (7) of the said lifter/support (8). This minimizes damage to lead pins (not shown in the FIGS.) of the IC devices (4) as well as the said test socket (16) during contact.

A test-base plate (11) in the said upper part (3) of the said test apparatus/handler (1) supports the housing during tests. The test-base plate (11) comprises a sensing element (9), a rubber/insulating seal (12), an alignment plate (17), a load board (15), an insulator plate (14) and a test socket (16).

Fitting (5) connects to a vacuum hose (not shown in FIGS.) in the said upper part (3). The fitting (5) is finally connected to a vacuum pump (not shown in FIGS.) located separately which moves air from any direction opposite to the test pins (not shown in FIGS.) of the test socket (16) and creates a vacuum chamber inside the area created by the said lift/support (8) and the said test socket (16), causing the supported un-moulded DUTs (4) to move upward towards the test socket (16) and into physical contact with the test pins of the test socket (16).

It is to be understood, however, that although the characteristics and advantages of the present invention have been set forth in the foregoing description, the disclosure is illustrative only, and changes may be made in the arrangement of the parts within the scope of the appended claims.

The above description is of the preferred embodiment. Various alterations and changes can be made without departing from the spirit and broader aspects of the invention as defined in the appended claims, which are to be interpreted in accordance with the principles of patent law including the doctrine of equivalents. Any references to claim elements in the singular, for example, using the articles "a," "an," "the," or "said," is not to be construed as limiting the element to the singular.

What is claimed is:

1. A test apparatus/handler (1) for testing un-moulded IC devices using air flow system, comprising:

a support (8) for resting a plurality of IC devices (4), moving against gravity towards a test socket (16), the support (8) being connected to a support holder that moves up against the test socket (16), the support (8) supporting the plurality of IC devices (4) to be tested by the test socket (16) and sandwiches the plurality of IC devices (4) between the test socket (16) and the support holder, air being flown out from any direction opposite to test pins of the test socket (16) and an insulating seal (12) resting above an alignment plate (17) which in turn rests on an insulator plate (14), the alignment plate (17) resting upon the insulator plate (14) which in turn rests on a load board (15), the load board (15) being in contact with an opposite side of the test socket (16), the insulating seal (12) seals off the air and creates a vacuum chamber inside a room created by the support (8) and the test socket (16) causing the plurality of IC devices (4) to move upwards towards the test socket (16) and to thereby have physical contact with the test pins of the test socket (16);

an upper part (3) comprising the alignment plate (17) resting above the insulator plate (14) made of non-conductor insulating material aligning the test socket (16) by accurately positioning the plurality of IC devices (4) to be tested in a test position without a positioning error and damages to lead pins of the plurality of IC devices (4), the alignment plate (17) resting below a test-base plate (11) being guided mechanically by at least four guide posts (6) during upward movement of the support (8) on which the plurality of IC devices (4);

a sensing element (9) in the upper part (3) of the test apparatus/handler (1) for sensing the positioning alignment of the test socket (16) and the plurality of IC devices (4), the sensing element (9) in turn senses and feedbacks signals to the alignment plate (17) and thereby accurately positions the plurality of IC devices (4) by movably changing the place of the plurality of IC devices (4) on guide tracks (7) of the support (8) thereby reducing chances of damage to the lead pins of the plurality of IC devices (4) as well as the test socket (16) during contact;

a test-base plate (11) in the upper part (3) of the test apparatus/handler (1) supporting the sensing element (9), the insulating seal (12), the alignment plate (17), the load board (15), the insulator plate (14) and the test socket (16);

a fitting (5) to connect to a vacuum hose in the upper part (3) of the test apparatus/handler (1) finally connected to a vacuum pump located separately which flows out air from any direction opposite to the test pins of the test socket (16) and creates the vacuum chamber inside the room created by the support (8) and the test socket (16) causing the plurality of IC devices (4) to move upward towards the test socket (16) thereby having physical contact with the test pins of the test socket (16); and a lower part (2) of the test apparatus/handler (1) comprising the at least four guide posts (6) fastened to a housing base plate (18) by nuts (19), the housing base plate (18) of the lower part (2) having the support (8) which is movable in upward direction during a test and in downward direction after the test, and both the support (8) and the support holder being rest on the housing base plate (18).

2. The test apparatus/handler (1) according to claim 1, wherein the plurality of IC devices (4) are un-moulded.

3. The test apparatus/handler (1) according to claim 1, wherein a pressure differential is created between the upper part (3) and the lower part (2) of the test apparatus/handler (1), higher pressure being on an extreme lower portion of a channel of the test apparatus/handler (1).

4. The test apparatus/handler (1) according to claim 1, wherein the test fitting (5) connected to the vacuum hose is capable of using air flow to force the plurality of IC devices (4) and pivoted gold test fingers of a test site together thereby using air to contact the plurality of IC devices (4) with pivoted gold test fingers ensuring minimal damage to the IC.

5. The test apparatus/handler (1) according to claim 1, wherein plurality of IC devices (4) to be tested need not to be molded during testing on the test apparatus/handler (1) thereby saving the cost of die casting materials.

6. The test apparatus/handler according to claim 1, wherein the plurality of IC devices (4) are accommodated for testing.

7. A method of testing un-moulded IC devices (4), wherein the method comprises the steps of:

moving upwards a lift/support (8) against a gravity towards a test socket (16) having a plurality of test pins, the lift/support (8) being connected to a support holder that closes up against the test socket (16), the lift/support (8) supporting a plurality of IC devices (4) to be tested by the test socket (16) and sandwiches the plurality of IC devices (4) in between the test socket (16) and the support holder;

flowing out air from any direction opposite to the plurality of test pins of the test socket (16) and a rubber/insulating seal (12) resting above an alignment plate (17) which in turn rests on an insulator plate (14), the alignment plate (17) being resting upon insulator plate (14) which in turn rests on load board (15), the load board (15) being in contact with an opposite side of the test socket (16);

sealing off the air by the insulating seal (12) and creating a vacuum chamber inside a room created by the lift/support (8) and the test socket (16) causing the plurality of IC devices (4) to move upwards towards the test socket (16) thereby have physical contact with the plurality of test pins of the test socket;

aligning the test socket by accurately positioning the plurality of IC devices (4) to be tested in a test position without a positioning error and damages to lead pins of the plurality of IC devices (4), the alignment plate (17) resting below a housing base plate (18) being guided mechanically by at least four guide posts (6) during upward movement of the support holder on which the plurality of IC devices (4) rest;

sensing the positioning alignment of the said test socket (16) and the (4) by a sensing element (9) in an upper part (3), the sensor (9) in turn senses and feedbacks signals to the alignment plate (17) thereby accurately positions the plurality of IC devices (4) by movably changing the place of the plurality of IC devices (4) on guide tracks (7) of the said lifter/support (8) thereby reducing chances of damage to lead pins of the plurality of IC devices (4) as well as the test socket (16) during contact;

flowing out air from any direction opposite to the plurality of test pins of the test socket (16) and creating a vacuum chamber inside a room created thereof by a vacuum hose in the upper part (3) of a test apparatus/handler (1) connected to a vacuum pump located separately causing the plurality of IC devices (4) to move upward towards the test socket (16) thereby having physical contact with the plurality of test pins of the test socket (16).

8. A method of testing according to claim 7, wherein air flow forces the plurality of IC devices (4) and pivoted gold test fingers of a test site together to contact the plurality of IC devices (4) with the pivoted gold test fingers.

9. A method of testing according to claim 7, wherein air vacuum forces the plurality of IC devices surfaces to get contact with pivoted gold test fingers of a test site ensuring minimal damage to the plurality of IC devices (4) and thereby avoiding physical strength for the said contact.

10. A method of testing according to claim 7, wherein the said method uses the test apparatus/handler (1) to decrease index time in order to improve overall operating efficiency and costs of the said test apparatus/handler (1).

* * * * *